US00RE42318E

(19) United States
(12) Reissued Patent
Haba

(10) Patent Number: US RE42,318 E
(45) Date of Reissued Patent: May 3, 2011

(54) SEMICONDUCTOR MODULE WITH SERIAL BUS CONNECTION TO MULTIPLE DIES

(75) Inventor: Belgacem Haba, Saratoga, CA (US)

(73) Assignee: Rambus Inc., Los Altos, CA (US)

(21) Appl. No.: 11/398,458

(22) Filed: Apr. 4, 2006

Related U.S. Patent Documents

Reissue of:
(64) Patent No.: 6,833,984
Issued: Dec. 21, 2004
Appl. No.: 10/071,298
Filed: Feb. 7, 2002

U.S. Applications:
(63) Continuation-in-part of application No. 09/564,064, filed on May 3, 2000, now Pat. No. 6,449,159.

(51) Int. Cl.
*H02H 9/00* (2006.01)

(52) U.S. Cl. ..... 361/58; 361/707
(58) Field of Classification Search ..... 361/707, 361/709, 710, 728, 747, 748, 749, 58, 704, 361/705; 326/30; 174/282, 262
See application file for complete search history.

(56) References Cited

U.S. PATENT DOCUMENTS

| | | | | | |
|---|---|---|---|---|---|
| 3,506,877 | A | | 4/1970 | Owen | 361/715 |
| 3,654,580 | A | | 4/1972 | Laisi | 338/61 |
| 3,868,724 | A | | 2/1975 | Perrino | 357/65 |
| 4,314,270 | A | | 2/1982 | Iwatani | 357/75 |
| 4,377,855 | A | * | 3/1983 | Lavi | 365/49.17 |
| 4,737,903 | A | * | 4/1988 | Nishikawa et al. | 363/144 |
| 4,811,165 | A | * | 3/1989 | Currier et al. | 361/716 |
| 4,858,703 | A | | 8/1989 | Gregory | 361/388 |
| 4,879,588 | A | | 11/1989 | Ohtsuka et al. | 357/68 |
| 4,914,551 | A | * | 4/1990 | Anschel et al. | 361/714 |
| 5,045,921 | A | * | 9/1991 | Lin et al. | 257/680 |
| 5,066,250 | A | * | 11/1991 | Welsh | 439/681 |
| 5,090,920 | A | | 2/1992 | Casey | 439/540 |
| 5,161,986 | A | | 11/1992 | Gulbranson et al. | 439/92 |
| 5,179,501 | A | | 1/1993 | Ocken et al. | 361/388 |
| 5,213,868 | A | | 5/1993 | Liberty et al. | 428/131 |
| 5,214,318 | A | * | 5/1993 | Nakanishi et al. | 326/124 |
| 5,224,023 | A | | 6/1993 | Smith et al. | 361/412 |
| 5,229,916 | A | | 7/1993 | Frankeny et al. | 361/386 |
| 5,268,813 | A | | 12/1993 | Chapman | 361/704 |

(Continued)

OTHER PUBLICATIONS

NN87081353, Concept for Forming Multilayer Structure for Electronic Packaging, Aug. 1, 1987, IBM Technical Disclosure.*

(Continued)

*Primary Examiner*—Stephen W. Jackson
*Assistant Examiner*—Zeev Kitov
(74) *Attorney, Agent, or Firm*—Morgan, Lewis & Bockius LLP

(57) ABSTRACT

A semiconductor module is provided which includes a [beat] *heat* spreader, at least two semiconductors thermally coupled to the heat spreader, and a plurality of electrically conductive leads electrically connected to the semiconductors. At least one of the electrically conductive leads is common to both of the semiconductors. The semiconductor module also includes a termination resistor electrically coupled to at least one of the semiconductors. A method of making a semiconductor module is also taught, whereby a plurality of electrically conductive leads are provided. At least two semiconductors are electrically coupled to the plurality of electrically conductive leads, where at least one of the electrically conductive leads is common to both of the semiconductors. The semiconductors are then thermally coupled to a heat spreader. Subsequently, a termination resistor is electrically coupled to at least one of the semiconductors.

45 Claims, 15 Drawing Sheets

U.S. PATENT DOCUMENTS

| | | | | | |
|---|---|---|---|---|---|
| 5,276,418 | A | | 1/1994 | Klosowiak et al. | 335/202 |
| 5,315,153 | A | | 5/1994 | Nagai et al. | 257/701 |
| 5,386,341 | A | | 1/1995 | Olson et al. | 361/749 |
| 5,468,999 | A | | 11/1995 | Lin et al. | 257/784 |
| 5,477,933 | A | * | 12/1995 | Nguyen | 174/262 |
| 5,485,351 | A | * | 1/1996 | Hopfer et al. | 361/704 |
| 5,518,964 | A | | 5/1996 | DiStefano et al. | 437/209 |
| 5,527,998 | A | * | 6/1996 | Anderson et al. | 174/255 |
| 5,550,406 | A | | 8/1996 | McCormick | 257/666 |
| 5,640,305 | A | * | 6/1997 | Smithers | 361/719 |
| 5,663,661 | A | * | 9/1997 | Dillon et al. | 326/30 |
| 5,703,436 | A | | 12/1997 | Forrest et al. | 313/506 |
| 5,751,553 | A | | 5/1998 | Clayton | 361/749 |
| 5,763,952 | A | | 6/1998 | Lynch et al. | 257/735 |
| 5,764,489 | A | | 6/1998 | Leigh et al. | 361/777 |
| 5,777,345 | A | | 7/1998 | Loder et al. | 257/777 |
| 5,785,535 | A | * | 7/1998 | Brodsky et al. | 439/73 |
| 5,804,004 | A | | 9/1998 | Tuckerman et al. | 156/60 |
| 5,808,870 | A | * | 9/1998 | Chiu | 361/705 |
| 5,925,934 | A | | 7/1999 | Lim | 257/778 |
| 5,926,369 | A | | 7/1999 | Ingraham et al. | 361/699 |
| 5,926,951 | A | | 7/1999 | Khandros et al. | 29/843 |
| 5,936,850 | A | | 8/1999 | Takahashi et al. | 361/784 |
| 5,940,721 | A | | 8/1999 | Kinzer et al. | 438/454 |
| 5,949,657 | A | | 9/1999 | Karabatsos | 361/803 |
| 5,954,536 | A | * | 9/1999 | Fuerst et al. | 439/493 |
| 5,959,839 | A | | 9/1999 | Gates | 361/704 |
| 5,963,427 | A | * | 10/1999 | Bollesen | 361/704 |
| 5,995,370 | A | | 11/1999 | Nakamori | 361/704 |
| 5,998,864 | A | | 12/1999 | Khandros et al. | 257/723 |
| 6,002,589 | A | | 12/1999 | Perino et al. | 361/749 |
| 6,005,778 | A | | 12/1999 | Spielberger et al. | 361/770 |
| 6,007,357 | A | | 12/1999 | Perino et al. | 439/327 |
| 6,009,487 | A | | 12/1999 | Davis et al. | 710/105 |
| 6,023,103 | A | | 2/2000 | Chang et al. | 257/781 |
| 6,034,878 | A | | 3/2000 | Osaka et al. | 365/52 |
| 6,040,624 | A | | 3/2000 | Chambers et al. | 257/692 |
| 6,049,476 | A | | 4/2000 | Laudon et al. | 365/52 |
| 6,072,700 | A | | 6/2000 | Nam | 361/783 |
| 6,093,969 | A | | 7/2000 | Lin | 257/777 |
| 6,094,075 | A | | 7/2000 | Garrett, Jr. et al. | 327/108 |
| 6,115,909 | A | * | 9/2000 | Miller | 29/741 |
| 6,133,629 | A | | 10/2000 | Han et al. | 257/698 |
| 6,137,682 | A | | 10/2000 | Ishimine et al. | 361/704 |
| 6,172,895 | B1 | * | 1/2001 | Brown et al. | 365/63 |
| 6,180,881 | B1 | | 1/2001 | Isaak | 174/52.4 |
| 6,181,002 | B1 | | 1/2001 | Juso et al. | 257/686 |
| 6,184,587 | B1 | | 2/2001 | Khandros et al. | 257/784 |
| 6,185,122 | B1 | | 2/2001 | Johnson et al. | 365/103 |
| 6,212,073 | B1 | * | 4/2001 | Yamaguchi | 361/705 |
| 6,215,182 | B1 | | 4/2001 | Ozawa et al. | 257/723 |
| 6,229,217 | B1 | | 5/2001 | Fukui et al. | 257/777 |
| 6,234,820 | B1 | | 5/2001 | Perino et al. | 439/326 |
| 6,273,759 | B1 | | 8/2001 | Perino et al. | 439/631 |
| 6,341,971 | B1 | | 1/2002 | Choy et al. | 439/326 |
| 6,356,106 | B1 | * | 3/2002 | Greeff et al. | 326/30 |
| 6,376,904 | B1 | | 4/2002 | Haba et al. | 257/686 |
| 6,404,660 | B1 | | 6/2002 | Gamini et al. | 365/51 |
| 6,449,159 | B1 | | 9/2002 | Haba | 361/707 |
| 6,490,325 | B1 | | 12/2002 | Fiedler et al. | 375/257 |
| 6,496,889 | B1 | | 12/2002 | Perino et al. | 710/110 |
| 6,514,794 | B2 | | 2/2003 | Haba et al. | 438/109 |
| 6,520,789 | B2 | | 2/2003 | Daugherty, Jr. et al. | 439/329 |
| 6,530,062 | B1 | | 3/2003 | Liaw et al. | 716/2 |
| 6,532,157 | B1 | | 3/2003 | Glenn et al. | 361/767 |
| 6,545,875 | B1 | | 4/2003 | Perino et al. | 361/760 |
| 6,590,781 | B2 | | 7/2003 | Kollipara et al. | 361/760 |
| 6,608,507 | B2 | | 8/2003 | Garrett, Jr. et al. | 327/108 |
| 6,618,938 | B1 | | 9/2003 | Alagaratnam et al. | 29/840 |
| 6,621,373 | B1 | | 9/2003 | Mullen et al. | 333/81 |
| 6,657,871 | B2 | | 12/2003 | Perino et al. | 361/760 |
| 6,705,388 | B1 | | 3/2004 | Sorgo | 165/803 |
| 6,721,189 | B1 | | 4/2004 | Haba | 361/792 |
| 6,751,192 | B1 | | 6/2004 | Nakata | 370/222 |
| 6,754,129 | B2 | | 6/2004 | Khatri et al. | 365/226 |
| 6,765,800 | B2 | | 7/2004 | Haba et al. | 361/760 |
| 6,784,526 | B1 | | 8/2004 | Mezawa | 257/679 |
| 6,833,984 | B1 | | 12/2004 | Belgacem | 361/58 |

OTHER PUBLICATIONS

IBM Technical Disclosure Bulletin, Concept for Forming Multilayer Structures for Packaging, 5 pages, Aug. 1, 1987.

Request for Reexamination of US Patent No. 6,833,984 filed Aug. 19, 2005.

Decision, Sua Sponte, To Merge Reissue and Reexamination Proceedings mailed Dec. 11, 2006 for reexam control U.S. Appl. No. 90/007,681.

House–Keeping Amendment filed Jan. 10, 2007 and Certificate of Service for reexam control U.S. Appl. No. 90/007,681.

Response to Office Action and Certificate of Service filed Sep. 10, 2008 for related reexamination control U.S. Appl. No. 90/007,681.

Notification of Concurrent Proceedings Pursuant tp 37 C.F.R. § 1.565(a) filed Apr. 4, 2006 for reexam control No. U.S. Appl. No. 90/007,681.

Notice of Reexamination Request Filing Date, mailed Aug. 29, 2005 for reexam control U.S. Appl. No. 90/007,681.

Notice of Assignment of Reexamination Request mailed Aug. 29, 2005 for reexam control U.S. Appl. No. 90/007,681.

Ex Parte Reexamination Communication Transmittal Form for reexam control U.S. Appl. No. 90/007,681 dated Dec. 7, 2007.

Ex Parte Reexamination Communication Transmittal Form for reexam control U.S. Appl. No. 90/007,681 mailed Dec. 16, 2005.

Request for Continued Examination (RCE) transmittal and Certificate of Service filed Oct. 7, 2008 for reexam control U.S. Appl. No. 90/007,681.

Office Action miled Aug. 20, 2008 from related U.S. Appl. No. 11/754,199.

Office Action mailed Jun. 25, 2008 from related U.S. Appl. No. 11/754,206.

Office Action mailed Aug. 14, 2008 from related U.S. Appl. No. 11/754,211.

Office Action mailed Sep. 26, 2008 from related U.S. Appl. No. 11/754,212.

Office Action mailed Dec. 23, 2008 from related U.S. Appl. No. 11/754,206.

Office Action mailed Dec. 7, 2007 from related reexam U.S. Appl. No. 90/007,681.

Office Action mailed May 14, 2008 from related U.S. Appl. No. 11/754,199.

IEEE 100, The Authoritative Dictionary of IEEE Standard Terms, 7th Edition, 2000, IEEE Press, pp. 144, 704.

Selected Prosecution History U.S. Appl. No. 11/754,199 through May 25, 2010.

Selected Prosecution History U.S. Appl. No. 11/754,206 through May 25, 2010.

Selected Prosecution History U.S. Appl. No. 11/754,211 through May 25, 2010.

Selected Prosecution History U.S. Appl. No. 11/754,212 through May 25, 2010.

* cited by examiner

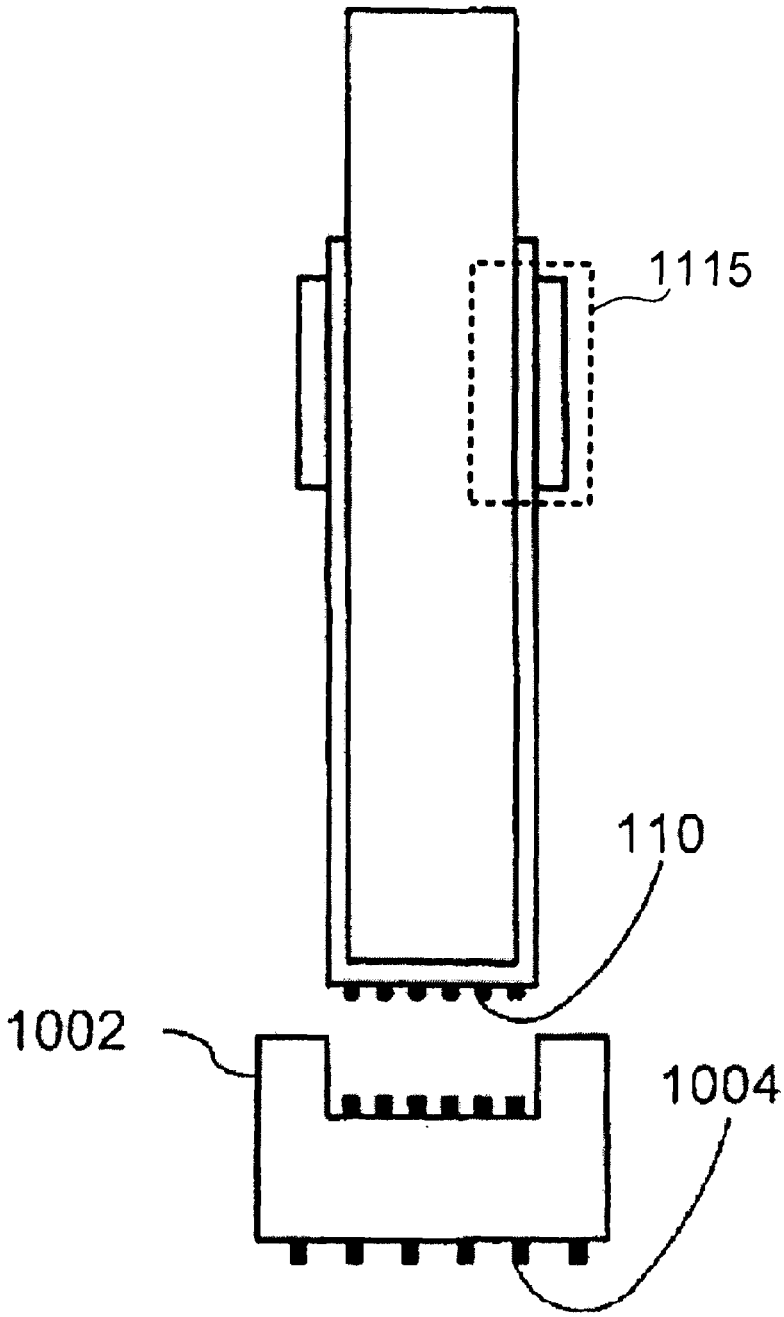
FIG. 10
(AMENDED)

SEMICONDUCTOR MODULE WITH SERIAL BUS CONNECTION TO MULTIPLE DIES

Matter enclosed in heavy brackets [ ] appears in the original patent but forms no part of this reissue specification; matter printed in italics indicates the additions made by reissue.

[This application a continuation-in-part of U.S. Ser. No. 09/554,064 filed on May 3, 2000 entitled "Semiconductor Module with Imbedded Heat Spreader"] *This application is a reissue application of U.S. Pat. No. 6,833,984, which is a continuation-in-part of U.S. application Ser. No. 09/564,064 filed on May 3, 2000 entitled "Semiconductor Module with Imbedded Heat Spreader", now U.S. Pat. No. 6,449,159; more than one reissue application has been filed for the reissue of U.S. Pat. No. 6,833,984 the reissue applications are application Ser. Nos. 11/398,458 filed on Apr. 4, 2006 (the present application); 11/754,199 filed on May 25, 2007; 11/754,206 filed on May 25, 2007; 11/754,211 filed on May 25, 2007; 11/754,212 filed on May 25, 2007; 12/790,380 filed on May 28, 2010; and 12/790,393, all of which are reissues of U.S. Pat. No. 6,833,984.*

TECHNICAL FIELD

The present invention relates generally to semiconductor modules and in particular to a semiconductor module that allows for more efficient interconnection between the semiconductor module an a computing device's transmission channel.

BACKGROUND OF THE INVENTION

The semiconductor industry is constantly producing smaller and more complex semiconductors, sometimes called integrated circuits or chips. This trend has brought about the need for smaller chip packages with smaller footprints, higher lead counts, and better electrical and thermal performance, while at the same time meeting accepted reliability standards.

In recent years a number of microelectronic packages have been produced to meet the need for smaller chip packaging. One such package is referred to as a chip scale package (CSP). CSPs are so called because the total package size is similar or not much larger than the size of the chip itself. Typically, the CSP size is between 1 and 1.2 times the perimeter size of the chip, or 1.5 times the area of the die. One example of a CSP is a product developed by TESSER® called "MICRO BGA" or μBGA. In a CSP, the semiconductor has a set of bond pads distributed across its surface. A first surface of an insulating, flexible film is positioned over the semiconductor surface. Interconnect circuitry is positioned within the film. Electrical connections are made between the interconnect circuitry and the semiconductor bond pads. Solder balls are subsequently attached to a second surface of the film in such a manner as to establish selective connections with the interconnect circuitry. The solder balls may then be attached to a printed circuit board.

CSPs may be used in connection with memory chips. Memory chips may be grouped to form in-line memory modules. In-line memory modules are surface mounted memory chips positioned on a circuit board.

As memory demands increase, so does the need for increased memory capacity of in-line memory modules. A need has also arisen for materials and methods that lead to increased performance by more closely matching the coefficient of thermal expansion of the materials used in these memory modules. Examples of such in-line memory modules are single in line memory modules or SIMMs and dual in-line memory modules or DIMMs. DIMMs have begun to replace SIMMs as the compact circuit boards of preference and essentially comprise a SIMM wherein memory chips are surface mounted to opposite sides of the circuit board with connectors on each side.

A problem with in-line memory modules is that adding more chips to the circuit board spreads out the placement of the chips on the circuit card and therefore requires reconfiguration of the circuit card connectors and their associated connections on the motherboard, which means replacing the memory card and in some cases the motherboard.

Another problem with current in-line memory modules is that a separate heat spreader must be positioned across a set of memory chips. The heat spreader adds cost to the assembly process and adds significant weight to the module.

Existing Multi-Chip Modules (MCM's) typically connect the transmission channel to semiconductors via electrical contact points or ball-outs on the MCM. Each electrical contact point then connects to a semiconductor in the MCM via an electrical lead, so that a signal may be transmitted along the transmission channel to each semiconductor via that semiconductor's electrical lead. However, each successive electrical lead slightly degrades the signal, by placing a load on the signal. By the time the signal reaches the last semiconductor connected to a transmission channel, the signal may have degraded so as to be unusable.

Modem MCM's, such as those disclosed in the U.S. patent application Ser. No. 09/564,064, disclose MCMs that include relatively long electrical leads. The longer the electrical lead, the more the signal degradation. This is because the speed of the signal is inversely related to the length of the electrical lead. Therefore, existing MCMs can only handle a maximum of approximately thirty two semiconductors connected to a single transmission channel before the signal has degraded to an unusable form.

In view of the foregoing it would be highly desirable to provide a semiconductor module that overcomes the shortcomings of the abovementioned prior art devices.

SUMMARY OF THE INVENTION

A semiconductor module is provided which includes a heat spreader, at least two semiconductors thermally coupled to the heat spreader, and a plurality of electrically conductive leads electrically connected to the semiconductors. At least one of the electrically conductive leads is common to both of the semiconductors The semiconductor module also includes a termination resistor electrically coupled to at least one of the semiconductors.

A method of making a semiconductor module is also taught, whereby a plurality of electrically conductive leads are provided. At least two semiconductors are electrically coupled to the plurality of electrically conductive leads, where at least one of the electrically conductive leads is common to both of the semiconductors. The semiconductors are then thermally coupled to a heat spreader. Subsequently, a termination resistor is electrically coupled to at least one of the semiconductors.

The termination resistor coupled to the semiconductors substantially reduces any degradation of the signal caused by a load placed on the signal from electrical leads, as the signal is not being split as is the case with stubs in existing semiconductor modules. Furthermore, by incorporating the termination resistor into the semiconductor module, the need for a termination resistor on the printed circuit board is eliminated, thereby reducing the need for additional circuit board space, and deceasing circuit board layout complexity and cost.

BRIEF DESCRIPTION OF THE DRAWINGS

For a better understanding of the nature and objects of the invention, reference should be made to the following detailed description taken in conjunction with the accompanying drawings, in which:

FIG. 10 is a side view of a semiconductor module according to another embodiment of the invention;

Like reference numerals refer to corresponding parts throughout the several views of the drawings.

DETAILED DESCRIPTION OF THE PREFERRED EMBODIMENTS

Figure 1:
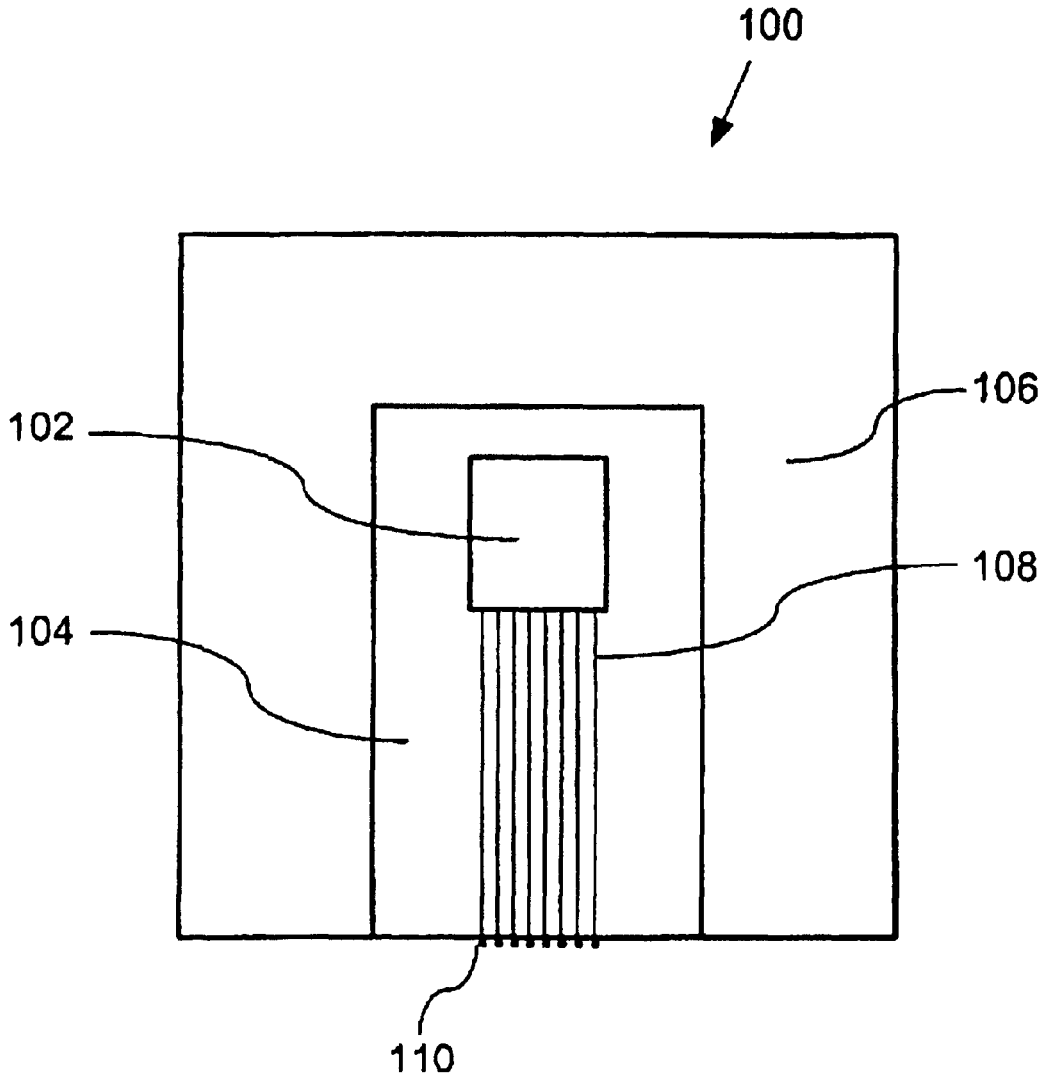
FIG. 1 is a front view of a semiconductor module according to an embodiment of the invention.

FIG. 1 is a front view of a semiconductor module 100 according to an embodiment of the invention. A semiconductor 102 is electrically connected to a plurality of traces or electrically conductive leads 108 by any conventional method such as wire bonding or thermocompression bonding. The electrically conductive leads 108 may be incorporated into flexible circuitry or tape 104, which preferably consists of copper traces within a thin dielectric substrate (such as polyimide, epoxy, etc.).

As shown in FIG. 1, the flexible circuitry 104 may be bonded, with an epoxy or the like, directly onto the side of the beat spreader 106. The heat spreader 106 is preferably made from a material with good heat dissipation properties, such as a metal.

In a preferred embodiment, two semiconductors 102 are positioned on opposing sides of the heat spreader 106. The leads 108 preferably run the length of each sides of the heat spreader 106, culminating at electrical contact points 110 at the base of the heat spreader 106. Electrical contact points 110 may for example comprise solder balls or bond pads. The semiconductors may further comprise of single dies or multiple stacked dies.

Figure 2:
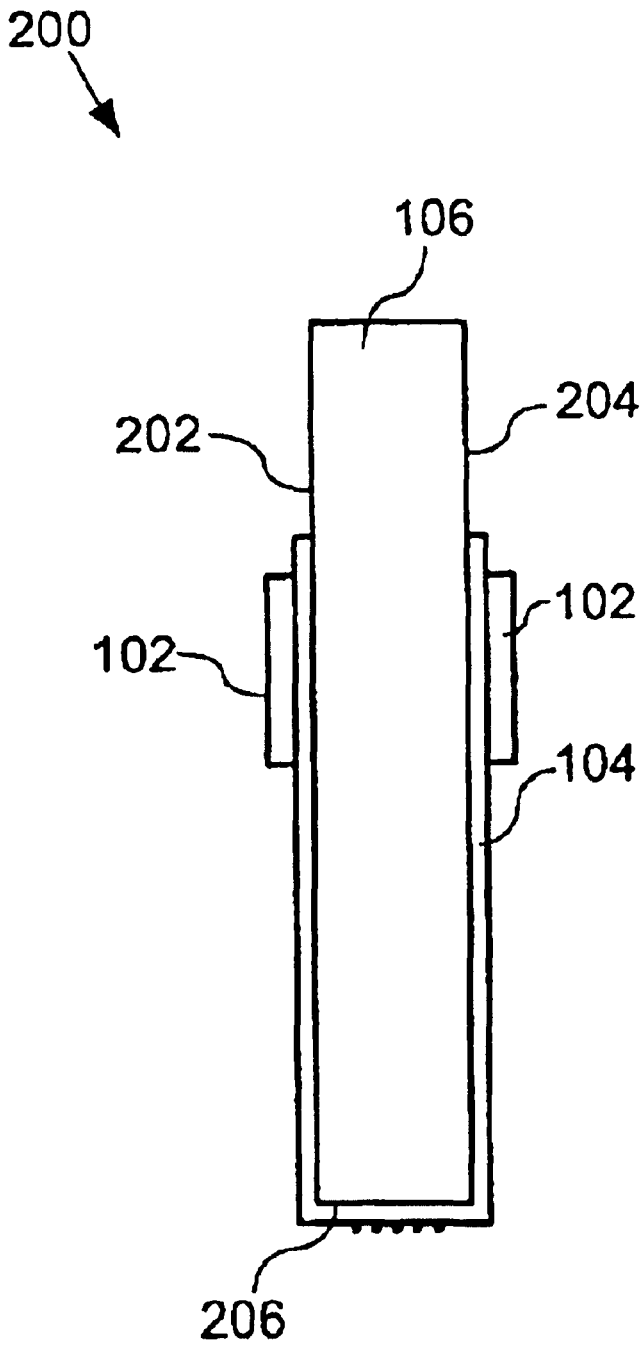
FIG. 2 is a side view of the semiconductor module shown in FIG. 1.

FIG. 2 is a side view of the semiconductor module 200 shown in FIG. 1. This view shows the semiconductors 102 and the flexible circuit 104 attached to both sides of the heat spreader 106. As can be seen, the flexible circuit 104 wraps around the sides walls 202 and 204 and base 206 of the heat spreader 106.

Figure 3:
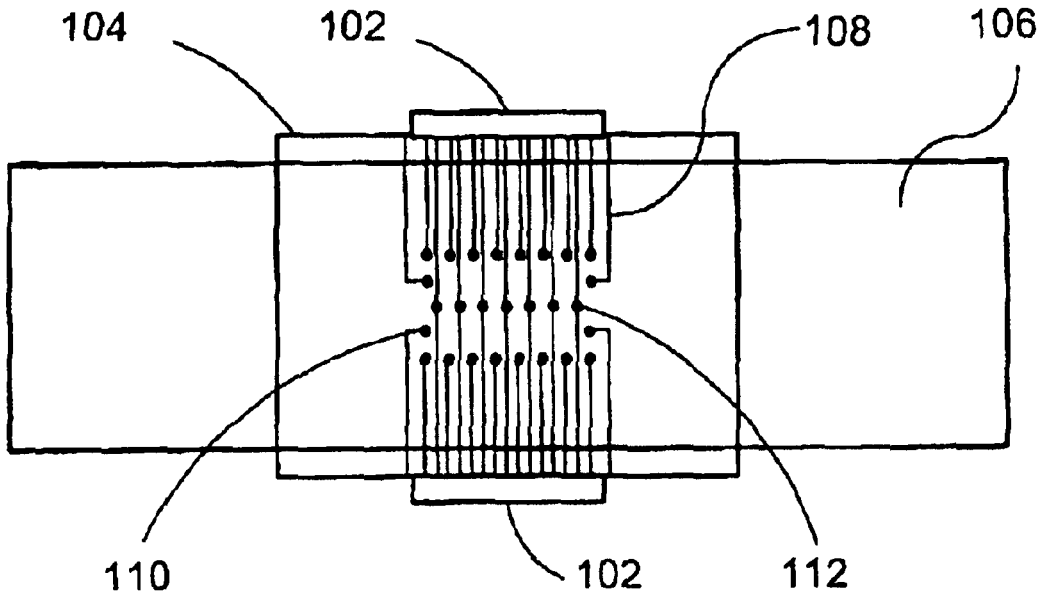
FIG. 3 is an underside view of the semiconductor module shown in FIG. 1.

FIG. 3 is an underside view of the semiconductor module shown in FIG. I. This figure more clearly shows the array of electrical contact points 110. Each lead 108 connects a semiconductor 102 to a distinct contact point 110. However, certain of the contact points 112 are common to both semiconductors 102. In this case, a single lead 108 connects both semiconductors 102 to a shared common contact point 112. Common contact points 112 may include a common voltage supply node, a reference voltage node, or an electrical ground node. Shared contact points 112 reduce the overall number of leads 108 and contact points 110 needed and therefore reduces the footprint of the module. The contact points 10 may be implemented as solder bumps or balls, metal points, or any other electrical connection. An advantage of placing the contact points at the base of the heat spreader 106 is that the contact points 110, being remote from the semiconductor 102, do not experience major temperature variations and therefore have reduced thermal mismatch stress. Thermal mismatch stress is caused by the low thermal expansion of the semiconductor 102 relative to the typically much higher expansion of a printed circuit board.

Figure 4:
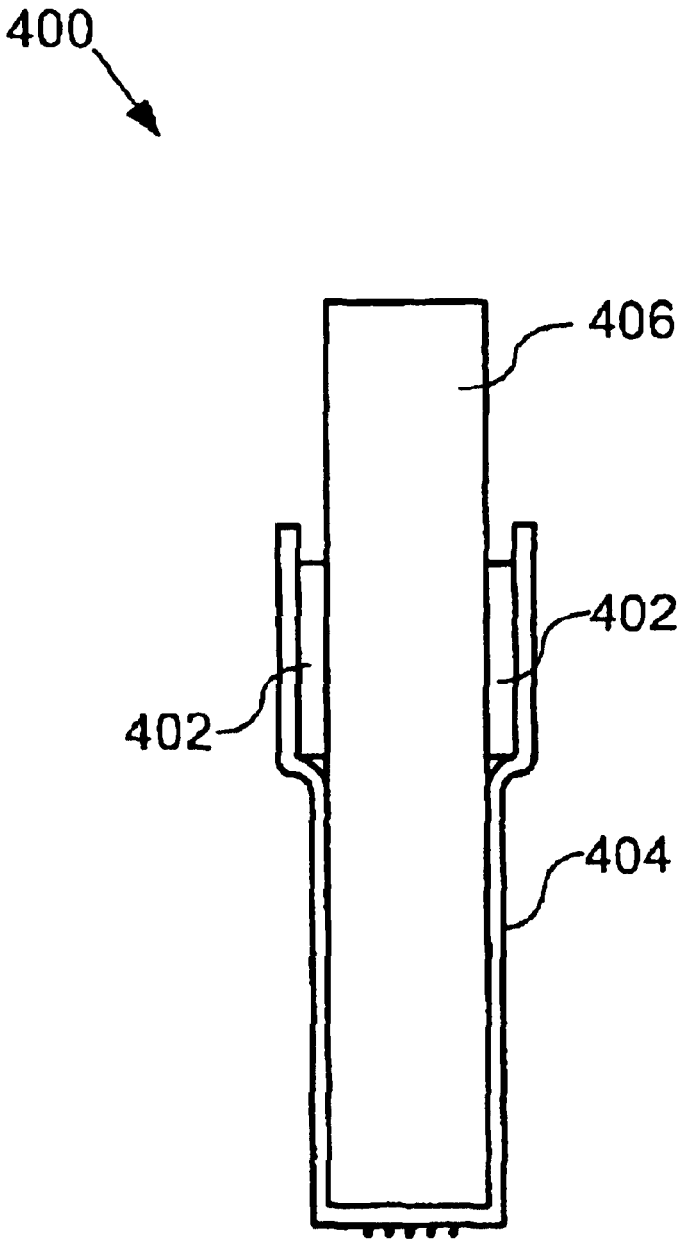
FIG. 4 is a side view of a semiconductor module according to another embodiment of the invention.

FIG. 4 is a side view of a semiconductor module 400 according to another embodiment of the invention. In this embodiment, semiconductors 402 on a flexible circuit 404, arc bonded directly to a heat spreader 406. The bond may be by any means but is preferably made by gluing the semiconductors 402, with an epoxy or the like, to the side of the heat spreader 406. The glue is chosen to closely match the thermal expansion properties of the semiconductor 402, heat spreader 406 and flexible circuit 404. The glue should also have good thermal conduction properties. This embodiment, where the semiconductors 402 are bonded directly to the heat spreader, 406 is favored due to the direct conduction of heat from the semiconductors 402 to the heat spreader 406.

Figure 5:
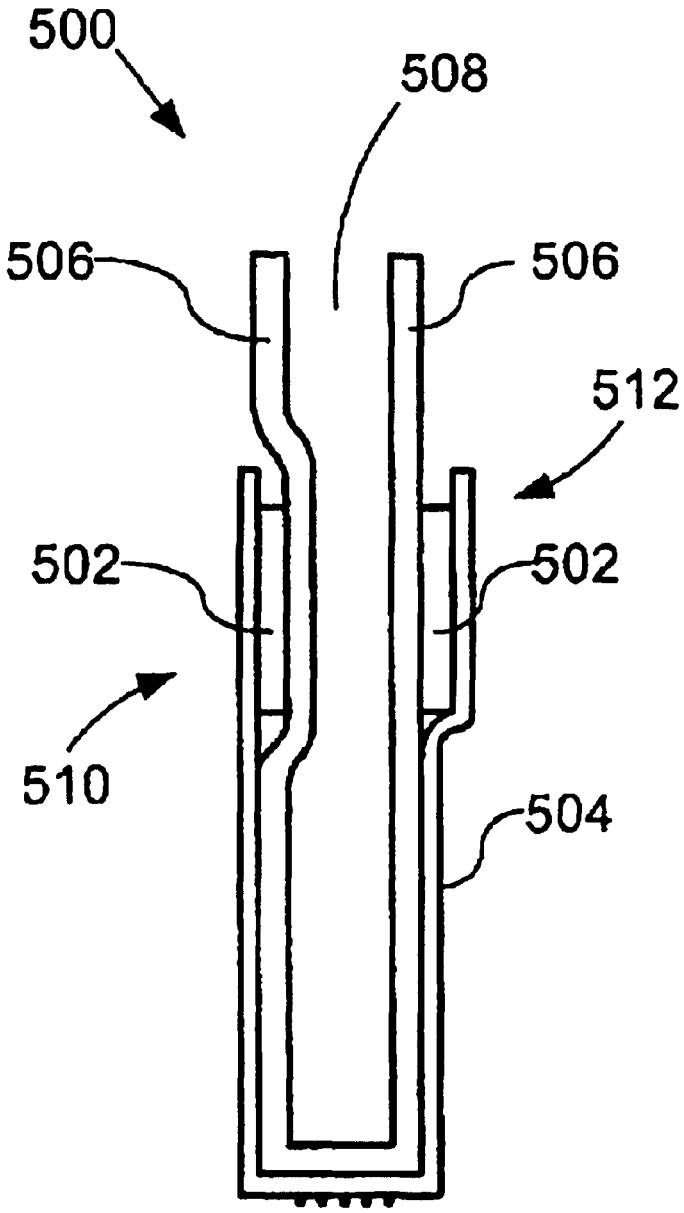
FIG. 5 is a side view of a semiconductor module according to yet another embodiment of the invention.

FIG. 5 is a side view of a semiconductor module 500 according to yet another embodiment of the invention. In this embodiment, the heat spreader 506 has a "u" shape defining a channel 508. This embodiment provides the benefit of increasing the surface area of the heat spreader 506 exposed to the surrounding air, thus increasing the rate that heat generated by the semiconductors 502 is dissipated to the surrounding air. Either the heat spreader 506 may conform to the shape of the flexible circuit 504 and semiconductor 502, or the flexible circuit 504 and semiconductor 502 may conform to the shape of the heat spreader 506. Both of these configurations are shown in FIG. 5, at 510 and 512 respectively.

Figure 6:
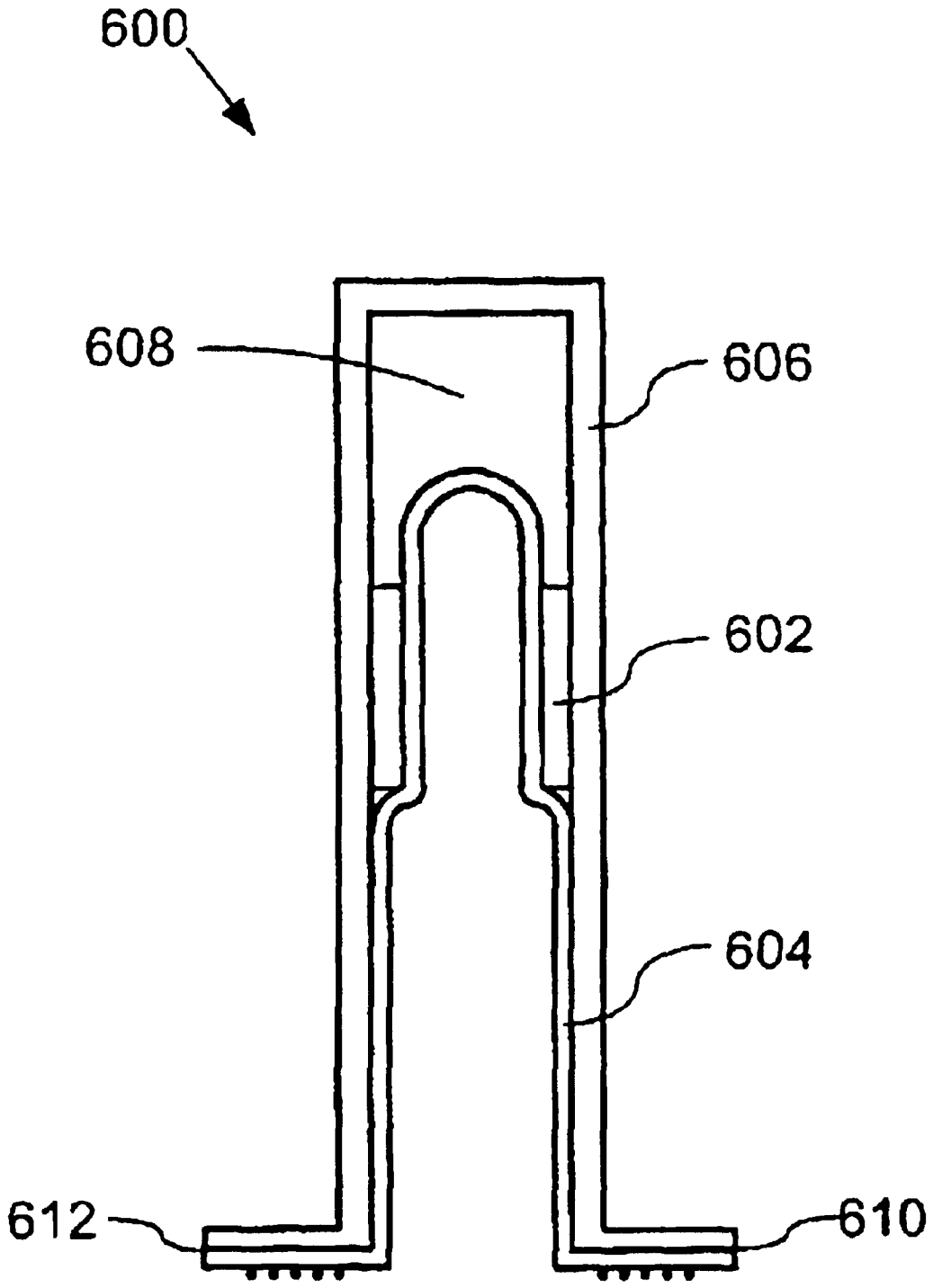
FIG. 6 is a side view of a semiconductor module according to still another embodiment of the invention.

FIG. 6 is a side view of a semiconductor module 600 according to still another embodiment of the invention. In this embodiment, the heat spreader 606 is in a "n" shape forming an interior channel 608. This embodiment also provides the benefit of increasing the surface area of the heat spreader 606 exposed to the surrounding air, thus increasing the rate heat generated by the semiconductors 602 is dissipated to the surrounding air. In this embodiment, the heat dissipating external surfaces may further dissipate heat by being exposed to an external air circulation device (e.g. a fan).

In the embodiments shown in FIGS. 1 to 5, signal channels in an electronic device may enter and exit the semiconductor module at electrical contact points in one area or footprint at the base of the heat spreader, as shown at 110 of FIG. 1. In the embodiment shown in FIG. 6, however, signal channels in an electronic device enter the semiconductor module 600 at electrical contact points 610 and exit from electrical contact points 612.

Figure 7:
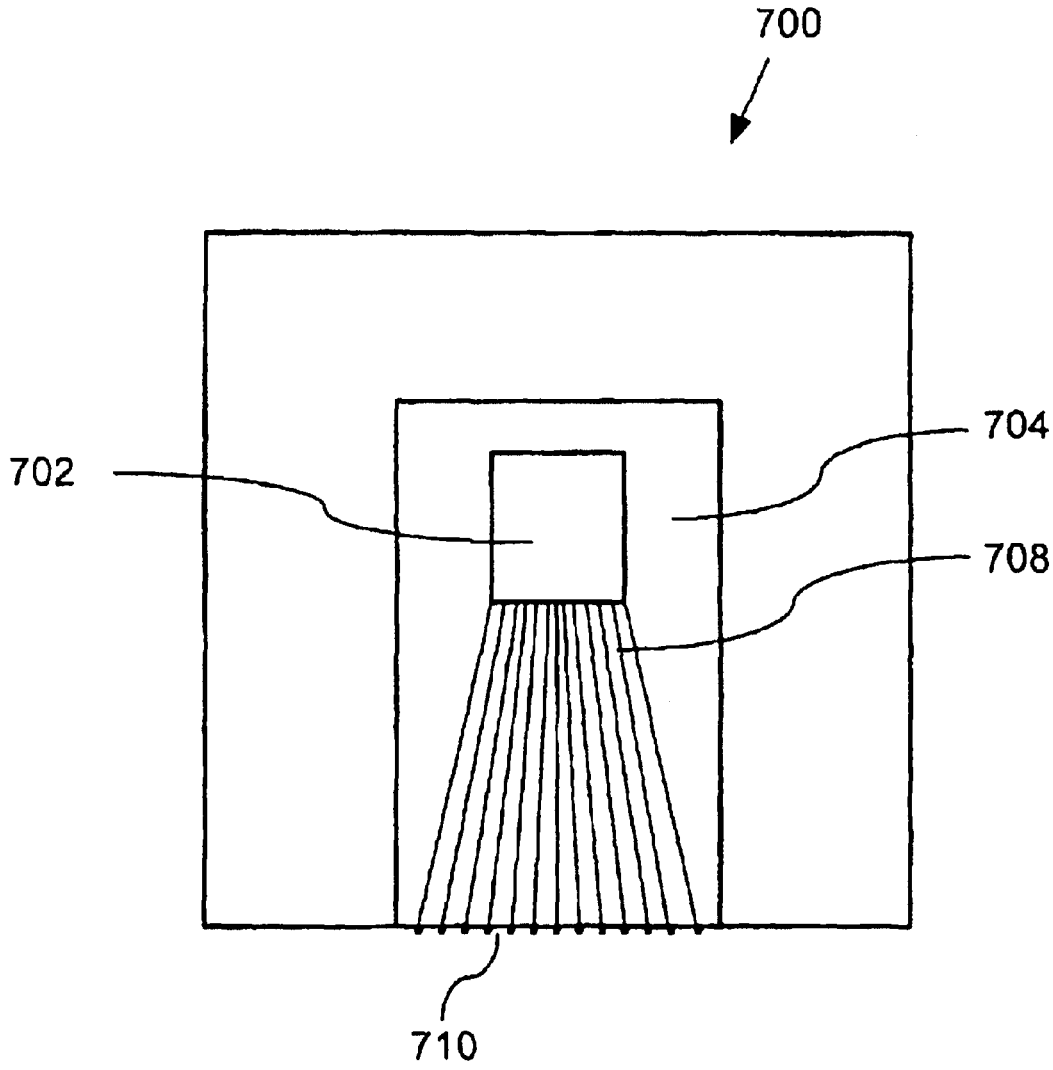
FIG. 7 is a front view of a semiconductor module according to another embodiment of the invention.

FIG. 7 is a side view of a semiconductor module 700 according to another embodiment of the invention. In this embodiment, leads 708 fan out on the flexible circuitry 704. That is, the leads 708 in the flexible circuitry 704 are closer together at the semiconductor 702 than at the array 710, which is more spread out than that shown in FIG. 1. The fanned out leads 708 create a more dispersed array with contact points 710 spaced further from one another. This embodiment compensates for a constant size footprint should larger semiconductors 702 be incorporated into the module at a later stage.

Figure 8:
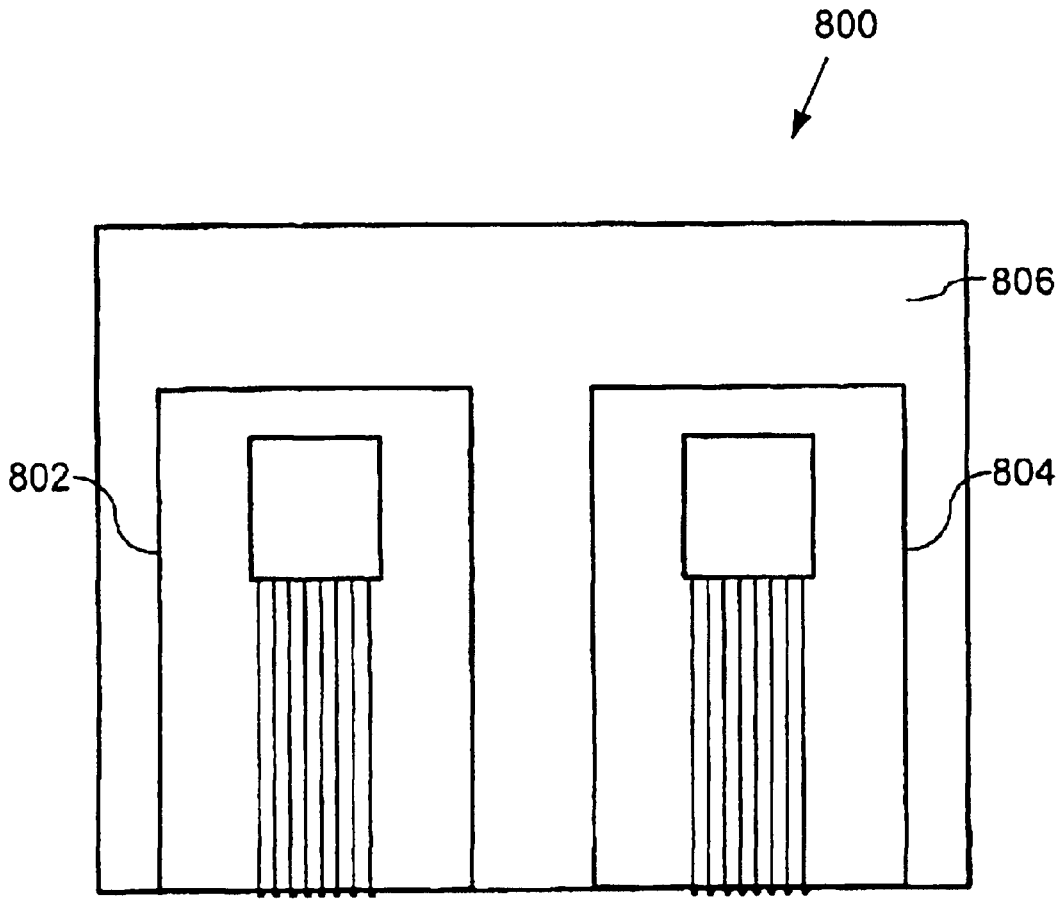
FIG. 8 is a front view of a semiconductor module according to yet another embodiment of the invention.

FIG. 8 is a side view of a semiconductor module 800 according to yet another embodiment of the invention. In this embodiment, two tape and semiconductor combinations 802 and 804 are placed on one heat spreader 806. Thus, the apparatus of FIG. 8 processes two or more separate signal channels with a single heat spreader 806.

Figure 9:
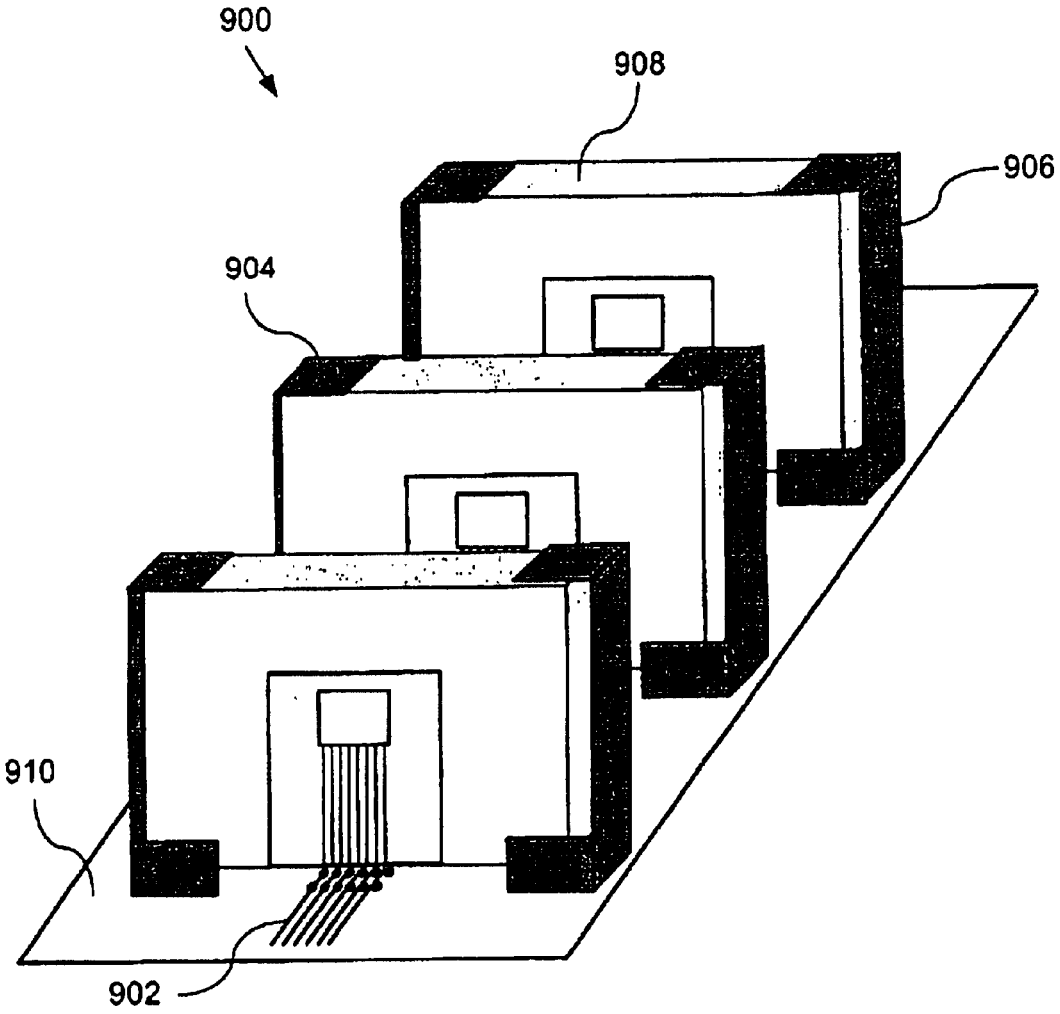
FIG. 9 is a perspective view of multiple semiconductor modules installed on a printed circuit board.

FIG. 9 is a perspective view 900 of multiple semiconductor modules 908 installed on a printed circuit board (PCB). The semiconductor modules 908 may be placed directly onto channels 902 on a PCB 910 or other suitable substrate, such that each electrical contact point electrically connects with a channel 902.

The semiconductor modules 908 maybe placed directly onto a PCB 910, such as a motherboard, or alternatively onto an in-line memory module circuit card which in turn slots into another PCB, such as a motherboard. In this manner the footprint of an in-line memory module circuit card may remain constant even if additional semiconductor modules 908 are slotted onto the in-line memory module circuit card. As the footprint of the array is always constant, the in-line memory module circuit card does not have to be changed each time additional memory is required, thereby enhancing the upgradability of electronic devices. The invention provides a memory module with a small footprint. Adding further chips to the module does not effect the footprint.

When in an aligned position, each electrical contact point electrically connects with a corresponding electrical contact on the substrate or PCB. Where the electrical contact points are solder bumps, the electrical connection between the semiconductor module and the PCB may be made by heating the solder bumps to cause reflow of the solder and allowing subsequent cooling, thereby fusing the semiconductor module 908 to the PCB 910.

Alternatively, or in addition, fastening mechanisms 904 and 906 may be provided for securely anchoring the semiconductor modules 908 onto the PCB 910. Such fastening mechanisms 904 and 906 may include clamps, slots, or the like.

FIG. 10 is a side view of a semiconductor module 1000 according to another embodiment of the invention. In this embodiment the semiconductor module 1000 connects to a pin grid array (PGA) socket or slot 1002, which in turn connects to a PCB. This embodiment is especially useful when connecting a semiconductor module to PCB's with incompatible footprints. In this way, a semiconductor module 1000 with a footprint created by electrical contact points 110, may be connected to a PCB with a different footprint, where electrical contacts 1004 on the PGA slot 1002 are arranged to correspond with the footprint on the PCB.

Figure 11:
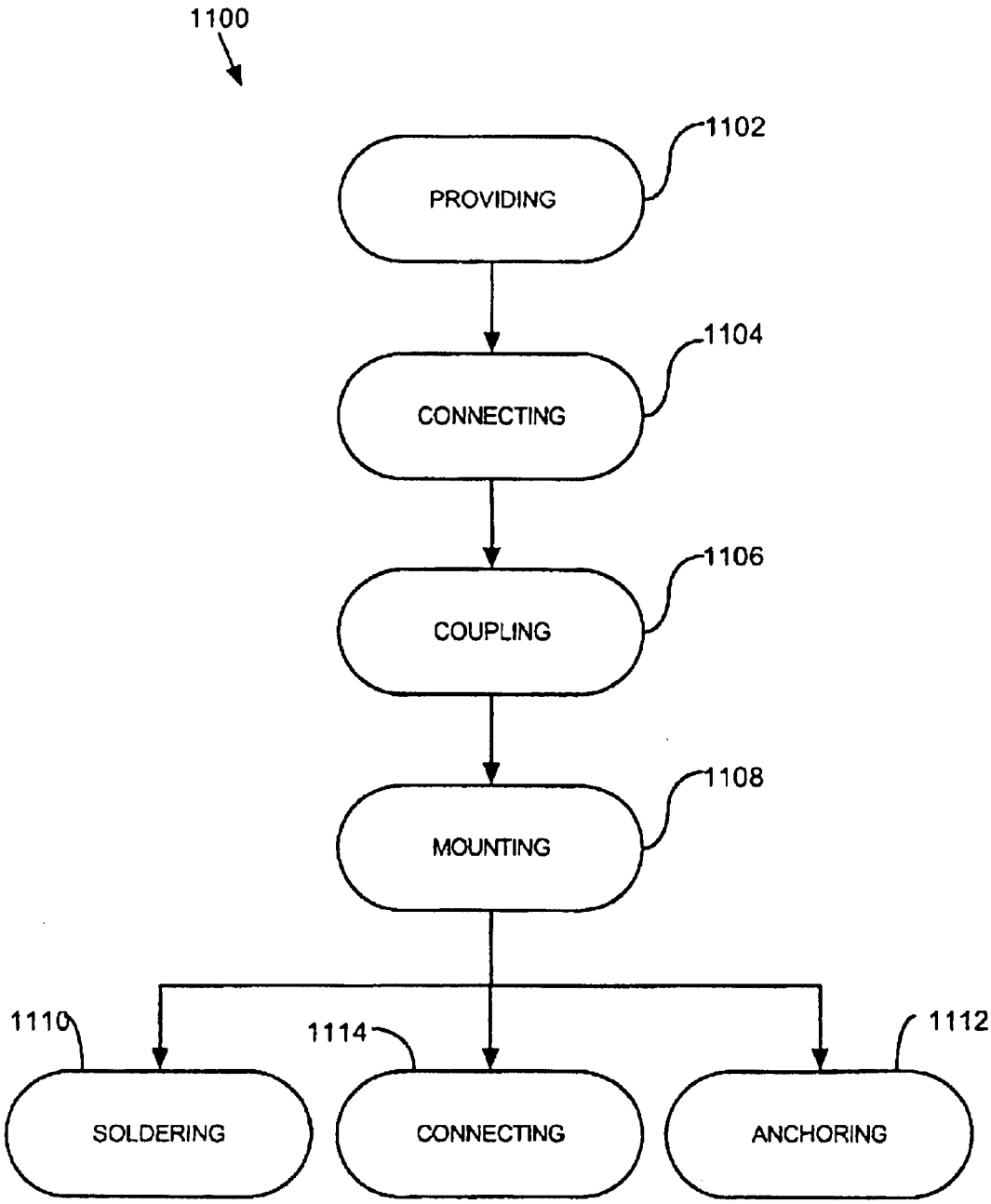
FIG. 11 is a flow chart of a method of making a semiconductor module according to an embodiment of the invention.

FIG. 11 is a flow chart of a method 1100 of making a semiconductor module according to an embodiment of the invention. A plurality of electrically conductive leads are provided 1102, preferably on a flexible circuit or tape. Two semiconductors are then electrically connected 1104 to the leads. The semiconductors are then thermally coupled 1106 to a heat spreader. This is preferably done by mounting 1108 the semiconductor directly to opposing walls of the heat spreader as shown in FIGS. 4–6. Alternately, the flexible tape may be used as the contact surface with the heat spreader as shown in FIG. 2. The leads may then be soldered 1110 to a PCB. The module may also be anchored 1112 to the PCB by means of a fastening mechanism as discussed above. Alternatively, the module may connect 1114 to a PGA as described in relation to FIG. 10. Anchoring 1112, soldering 1110, and connecting 1114 may occur simultaneously.

In an alternative embodiment, a semiconductor package such as a CSP may have its solder balls attached to the flexible circuitry. The combination of the semiconductor package and the flexible circuitry is then bonded to the heat spreader. In this manner existing semiconductor packages may be used to manufacture the semiconductor module according to the invention.

Another alternative embodiment may include shielding *1115* (*FIG. 10*) to protect the semiconductor from electromagnetic forces. In addition, adhesive may be placed between the tape and the base of the heat spreader to cushion the contact points and ensure contact between the contact points and the PCB.

The semiconductor module of the invention eliminates the need for a separate heat spreader. The invention reduces overall cost and weight through shared common contact points or nodes. The common contact points also allow for a constant footprint to be maintained independent of the size or number of semiconductors used. Furthermore, the module is reliable as the semiconductors are not exposed to as high thermal stresses. The module also substantially improves heat dissipation by exposing greater surface areas to the surrounding air.

Multi-Chip Modules

As explained above in the background section of this specification, many existing semiconductor modules position their embedded semiconductors relatively far from the circuit board to which they are attached. Each semiconductor in such semiconductor modules connects to a transmission channel via its own electrical lead. A signal passing along the transmission channel from lead to lead is degraded by a load placed on the signal by each successive lead. The longer the stub, the more the signal is degraded. Each successive lead further degrades the signal, until such time as the signal has been degraded so as to be useless. Most semiconductor modules also include a termination resistor at the end of each transmission channel on the printed circuit board. The present invention addresses the problem associated with signal degradation in semiconductor modules having relatively long electrical leads.

Impedance matching of an electrical load to the impedance of a signal source and the characteristic impedance of a transmission channel is often necessary to reduce reflections by the load, back into the transmission channel. As the length of a non-terminated transmission line increases, reflections become more problematic. When high frequency signals are transmitted or passed through even very short transmission lines, such as printed circuit board (PCB)

traces, a termination resistor may be inserted at the load to avoid reflections and degradations in performance.

In the multi-chip modules of the present invention, termination resistors are preferably internal to the MCM's. The use of external termination resistors presents a number of drawbacks. The placement of a termination resistor outside an MCM results in an additional stub or short transmission line between the termination resistor and the integrated circuit device. External termination resistors also require significant circuit board space, and increase circuit board layout complexity and cost.

Figure 12:
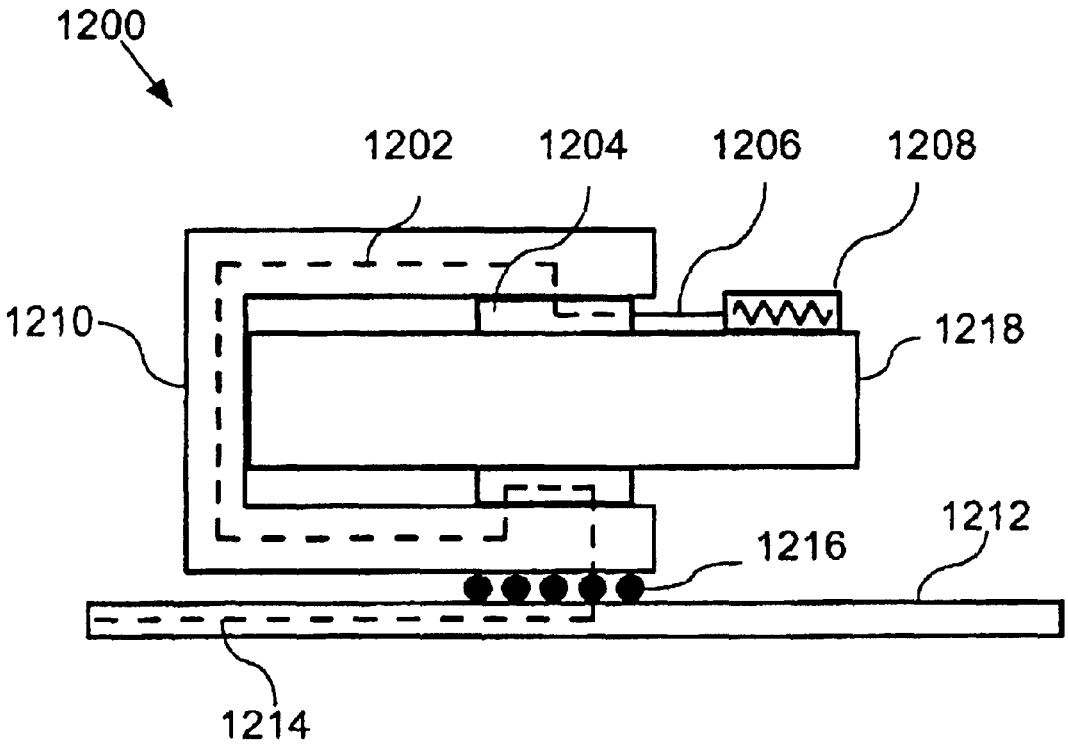
FIG. 12 is a side view of a semiconductor module according to yet another embodiment of the invention.

FIG. 12 shows a side view of a semiconductor module 1200 according to yet another embodiment of the invention. A number of semiconductors 1204 are electrically coupled to a plurality of traces or electrically conductive leads 1202 (only one is shown) by any conventional method such as wire bonding or thermocompression bonding. The electrically conductive leads 1202 are preferably incorporated into a flexible circuit or tape 1210, which preferably consists of copper traces within a thin dielectric substrate (such as polyimide, epoxy, etc.).

The semiconductors 1204 on the flexible circuit 1210, are preferably bonded directly to a heat spreader 1218. Alternatively, as shown and described in relation to FIG. 2, the flexible circuit 1210 may be bonded directly to the heat spreader 1218. The bond may be made by any means but is preferably made by gluing the semiconductors 1204 or flexible circuit 1210, with an epoxy or the like, to the side of the heat spreader 1218. The glue is chosen to closely match the thermal expansion properties of the semiconductor 1204, heat spreader 1218, and flexible circuit 1210. The glue should also have good thermal conduction properties. This embodiment, where the semiconductors 1204 are bonded directly to the heat spreader 1218 is favored due to the direct conduction of heat from the semiconductors 1204 to the heat spreader.

The heat spreader 1218 is preferably made from a material with good heat dissipation properties, such as a metal. In a preferred embodiment, the semiconductors 1204 are positioned on opposing sides of the heat spreader 1218. The electrical leads 1202 connect the semiconductors 1204 to electrical contact points 1216 at the base of the semiconductor module 1200. In use, electrical contact points 1216 may for example comprise solder balls or bond pads. The electrical contact points 1216 electrically couple the electrical leads 1202 to a transmission channel 1214 on a printed circuit board 1212. Electrical signals are transmitted along the transmission channel 1214 to electrical contact points 1216. The electrical signals are then passed from the electrical contact points 1216 through the electrical leads 1202 to each of the semiconductors 1204.

In this embodiment, the semiconductors 1204, on opposing sides of the heat spreader 1218, are connected to one another in series by the electrical lead 1202. It should be noted that multiple (i.e., more than two) semiconductors 1204 may be connected together in series. The final semiconductor in the series, remote from the transmission channel, electrically couples to a termination resistor 1208. The termination resistor 1208 is preferably thermally coupled to the heat spreader 1218 so that any heat built up in termination resistor 1208 can dissipate through the heat spreader.

The termination resistor 1208 connected in series to the semiconductors 1204 substantially reduces any degradation of the signal caused by a load placed on the signal from the electrical leads 1210, as the signal is not being split as is the case with stubs in existing semiconductor modules. A signal is transmitted from a signal source along the transmission channel 1214, along an electrical lead 1202, to each semiconductor 1204 connected in series, and is terminated at the termination resistor 1208. Furthermore, by incorporating the termination resistor 1208 into the semiconductor module 1200, the need for a termination resistor on the printed circuit board 1214 is eliminated.

This embodiment of the invention is particularly useful now that the memory capacity of individual semiconductors has increased to a point where only a few semiconductors are needed for many applications.

Figure 13:
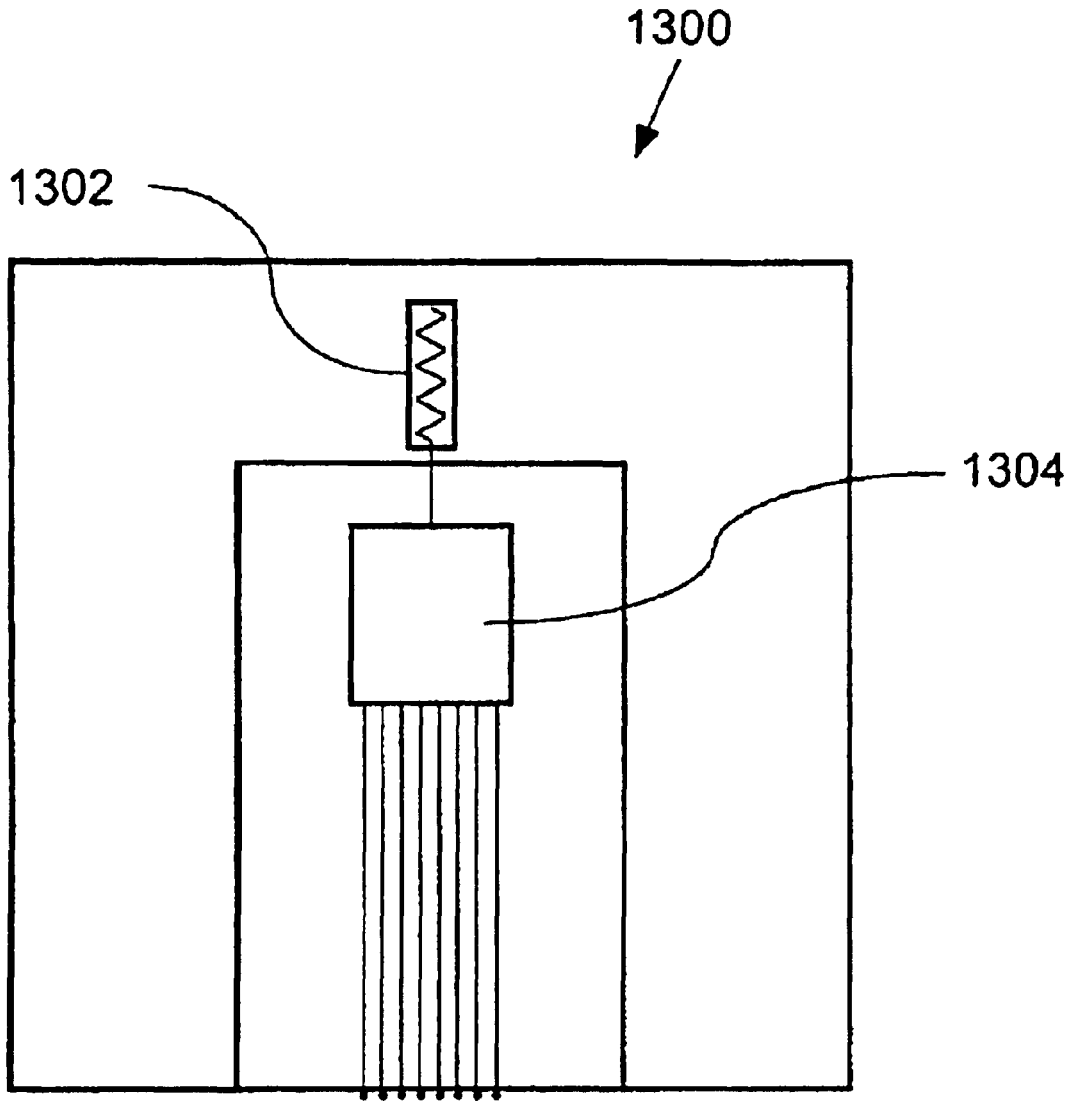
FIG. 13 is a front view of a semiconductor module according to a further embodiment of the invention.
Figure 14:
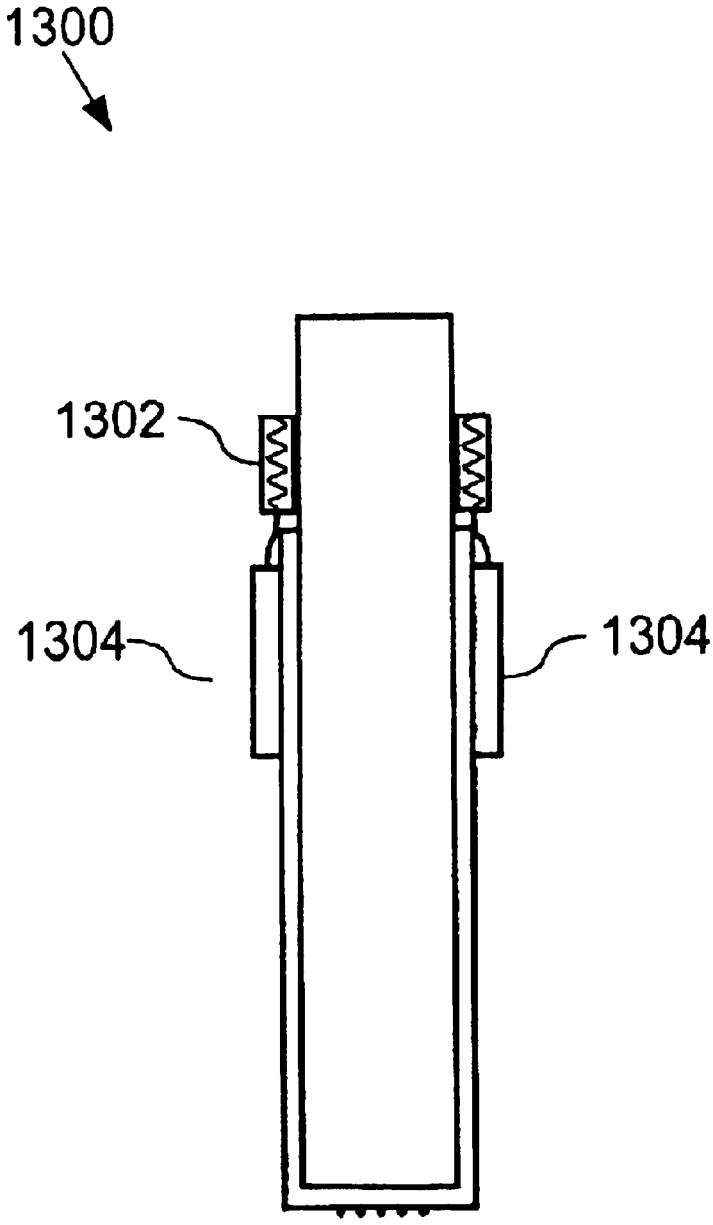
FIG. 14 is a side view of the semiconductor module shown in FIG. 13.

FIG. 13 is a front view of the semiconductor module 1300 according to a further embodiment of the invention. This semiconductor module 1300 is identical to the semiconductor module 100 shown in FIG. 1, except for a termination resistor 1302 disposed on the heat spreader. FIG. 14 is a side view of the same semiconductor module 1300 shown in FIG. 13. In this embodiment, the semiconductors 1304 are not connected in series, but rather each semiconductor connects to its own transmission channel. Likewise, each termination resistor 1302 connects to a single semiconductor. In use, a signal is transmitted along each transmission channel, to its respective semiconductor, after which it is terminated at a termination resistor 1402 to eliminate reflections.

The resistance value of the termination resistor 1208 (FIG. 2) or 1302 (FIGS. 13 and 14) is selected such that its impedance substantially matches the impedance of the transmission channel and signal source to which it is connected. Furthermore, any form of termination may be used, such as parallel termination, Thevenin termination, series termination, AC termination, [Schotty-diode] *Schottky-diode* termination or the like.

Figure 15:
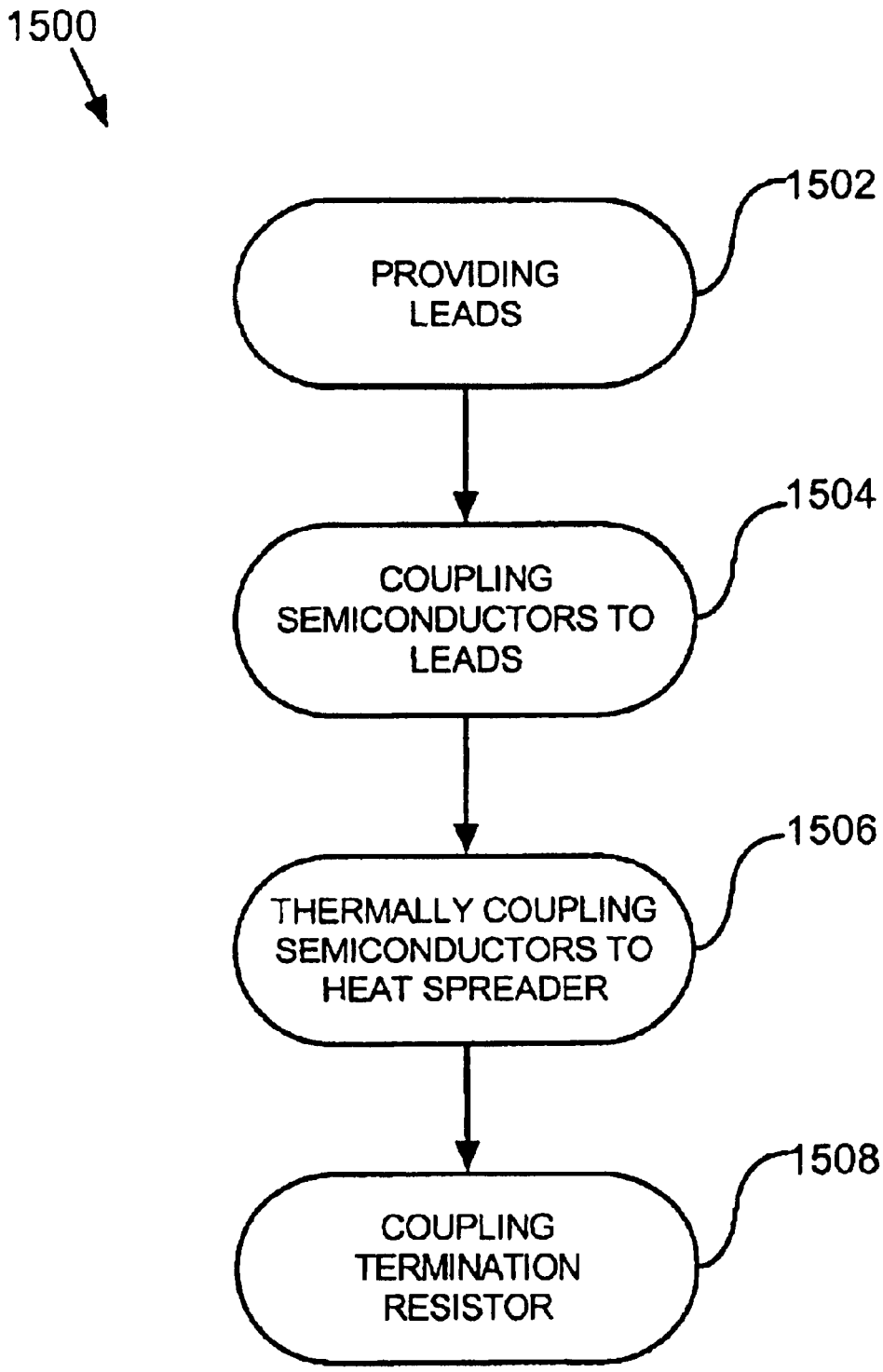
FIG. 15 is a flow chart of a method of making a semiconductor module according to another embodiment of the invention.

FIG. 15 is a flow chart of a method 1500 of making a semiconductor module according to another embodiment of the invention. According to the method 1500 a plurality of electrically conductive leads are provided (step 1502). At least two semiconductors are electrically coupled (step 1504) to the plurality of electrically conductive leads, where at least one of the electrically conductive leads is common to both of the semiconductors. The semiconductors are then thermally coupled (step 1506) to a heat spreader. Subsequently, a termination resistor is electrically coupled (step 1508) to at least one of the semiconductors.

The semiconductors may be electrically coupled in series, where the semiconductors are capable of being electrically coupled to a transmission channel. Moreover, an additional termination resistor may be electrically coupled to the semiconductor not already connected to the termination resistor, where each of the semiconductors is capable of being electrically coupled to a separate transmission channel.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. The presently disclosed embodiments are therefore to be considered in all respects as illustrative and not restrictive, the scope of the invention being indicated by the appended claims, and not limited to the foregoing description.

What is claimed is:

1. A semiconductor module, comprising:

a heat spreader *comprising a solid block of heat spreading material having a substantially planar first side, a substantially planar opposing second side and a respective edge between the first side and the second side*;

*a flexible circuit including a first portion bonded to at least part of the first side of the heat spreader, a second portion wrapped around the respective edge of the heat spreader, and a third portion bonded to at least part of the second side of the heat spreader;* at least two semiconductors *coupled to the flexible circuit and* thermally coupled to [said] *the* heat spreader, *wherein one of the semiconductors is disposed at the first side of the heat spreader and another one of the semiconductors is disposed at the second side of the heat spreader*; *and,*

[a plurality of electrically conductive leads electrically connected to said semiconductors, where at least one of said electrically conductive leads is common to both of said semiconductors; and a termination resistor electrically coupled to at least one of said semiconductors.]

*a plurality of electrical contacts disposed on the flexible circuit proximate to the second portion of the flexible circuit, where each of the plurality of electrical contacts is electrically coupled to at least one of the semiconductors via the flexible circuit, wherein the plurality of electrical contacts are configured to removeably couple the semiconductor module to corresponding electrical contacts formed in a slot on a circuit board when a portion of the semiconductor module, including the respective edge of the heat spreader, the second portion of the flexible circuit wrapped around the respective edge of the heat spreader, and the plurality of electrical contacts, is inserted into the slot.*

2. A semiconductor module according to claim 1, wherein [said] *at least some of the* semiconductors are electrically coupled to one another in series, and where [said] *the* semiconductors are capable of being electrically coupled to a transmission channel.

3. A semiconductor module according to claim 2, *further comprising a termination circuit electrically coupled to at least one of the semiconductors,* wherein a final semiconductor in said series, remote from [said] *the* transmission channel, is electrically coupled to [said] *the* termination [resistor] *circuit*.

4. A semiconductor module according to claim 1, wherein [one] *each* semiconductor of the *at least two* semiconductors is [not] connected to [said termination resistor, and an additional termination resistor is electrically coupled to the one semiconductor not connected to said termination resistor.] *a separate transmission channel, where each transmission channel is separately terminated.*

5. A semiconductor module according to claim 1, *further comprising a termination resistor electrically coupled to at least one of the semiconductors,* wherein a resistance value of the termination resistor is selected such that an impedance of [said] *the* termination resistor substantially matches an impedance of a transmission channel and a signal source to which [said] *the* termination resistor is connected.

6. A semiconductor module according to claim 1, *further comprising a termination circuit electrically coupled to at least one of the semiconductors,* wherein [said] *the* termination resistor's form of termination is selected from a group consisting of: parallel termination, Thevenin termination, series termination, AC termination, and [Schotty-diode] *Schottky-diode* termination.

7. A semiconductor module according to claim 1, *further comprising a termination circuit electrically coupled to at least one of the semiconductors,* wherein [said] *the* termination [resistor] *circuit* is thermally coupled to [said] *the* heat spreader.

8. A semiconductor module according to claim 1, *further comprising a termination circuit electrically coupled to at least one of the semiconductors,* wherein [said] *the* termination resistor is bonded directly to a side wall of [said] *the* heat spreader.

9. A semiconductor module according to claim 1, wherein [said] *the* two semiconductors are mounted on opposing side walls of [said] *the* heat spreader.

[10. A semiconductor module according to claim 2, wherein each of said semiconductors are bonded directly to said side wall of said heat spreader.]

11. A semiconductor module according to claim 1, wherein [said leads form part of a] *the* flexible circuit [at least partially attached to said heat spreader] *includes a plurality of electrically conductive leads electrically connected to the semiconductors, where at least one of the electrically conductive leads is common to both of the semiconductors.*

12. A semiconductor module according to claim 11, wherein [said] *the* flexible circuit is a flexible dielectric tape.

13. A semiconductor module according to claim 12, wherein [said] *the* flexible circuit is bonded directly to [said] *the* side wall of [said] *the* heat spreader.

14. A semiconductor module according to claim 11, wherein [said] *the* common electrically conductive lead is selected from a group consisting of a voltage supply node, a reference voltage node, and an electrical ground node.

[15. A semiconductor module according to claim 1, wherein said heat spreader is a solid block of heat dissipating material.]

[16. A semiconductor module according to claim 1, wherein said heat spreader is "u" shaped.]

17. A method of making a semiconductor module, comprising:

*providing a heat spreader comprising a solid block of heat spreading material having a substantially planar first side, a substantially planar opposing second side and a respective edge between the first side and the second side;*

*attaching a flexible circuit to the heat spreader including bonding a first portion to at least part of the first side of the heat spreader, wrapping a second portion around the respective edge of the heat spreader, and bonding a third portion to at least part of the second side of the heat spreader;*

[providing a plurality of electrically conductive leads;]

electrically coupling at least two semiconductors to [said plurality of electrically conductive leads, where at least one of said electrically conductive leads is common to both of said semiconductors;] *the flexible circuit;* thermally coupling [said] *the at least two* semiconductors to [a] *the* heat spreader, *wherein one of the semiconductors is disposed at the first side of the heat spreader and another one of the semiconductors is disposed at the second side of the heat spreader*; and

[electrically coupling a termination resistor to at least one of said semiconductors.]

*providing a plurality of electrical contacts disposed on the flexible circuit proximate to the second portion of the flexible circuit such that each of a plurality of electrical*

*contacts is electrically coupled to at least one of the semiconductors via the flexible circuit, wherein the plurality of electrical contacts are configured to removeably couple the semiconductor module to corresponding electrical contacts formed in a slot on a circuit board when a portion of the semiconductor module, including the respective edge of the heat spreader, the second portion of the flexible circuit wrapped around the respective edge of the heat spreader, and the plurality of electrical contacts, is inserted into the slot.*

18. A method according to claim 17, initially comprising electrically coupling [said] *at least some of the* semiconductors in series, where [said] *the* semiconductors are capable of being electrically coupled to a transmission channel.

19. A method according to claim 17, [further comprising] *wherein electrically coupling at least two semiconductors to the flexible circuit includes* electrically coupling [an additional termination resistor to the semiconductor not already connected to said termination resistor, where each of said semiconductors is capable of being electrically coupled] *each semiconductor* to a separate transmission channel, *where each transmission channel is separately terminated.*

20. A method according to claim 17, including *electrically coupling a termination circuit to at least one of the semiconductors; and* bonding [said] *the* termination resistor directly to a side wall of [said] *the* heat spreader.

21. A method according to claim 17, including mounting [said] *the* two semiconductors on opposing side walls of [said] *the* heat spreader.

[22. A method according to claim 17, including bonding each of said semiconductors directly to a side wall of said heat spreader.]

23. A method according to claim 17, wherein [said leads form part of a] *the* flexible circuit [at least partially attached to said heat spreader, said method including bonding said flexible circuit directly to a side wall of said heat spreader] *includes a plurality of electrically conductive leads electrically connected to the semiconductors, where at least one of the electrically conductive leads is common to both of the semiconductors.*

*24. A semiconductor module according to claim 1, further comprising a fastening mechanism for anchoring the semiconductor module to a circuit board.*

*25. A semiconductor module according to claim 24, wherein clamps anchor the semiconductor module to the circuit board.*

*26. A semiconductor module according to claim 1, wherein the plurality of electrical contacts disposed on the flexible circuit are a linear array of electrical contact pads coupled to the heat spreader.*

*27. A semiconductor module according to claim 26, wherein the plurality of electrical contact pads are an array of bond pads.*

*28. A semiconductor module according to claim 26, wherein the plurality of electrical contact pads are an array of metal points.*

*29. A semiconductor module according to claim 1, wherein the flexible circuit is at least partially bonded to the heat spreader using a bonding adhesive with thermal expansion properties similar to those of the flexible circuit and the heat spreader.*

*30. A semiconductor module according to claim 1, wherein the plurality of electrical contacts are disposed at on a section the flexible circuit that is bonded to the heat spreader, and the section the flexible circuit having the plurality of electrical contacts disposed thereon is bonded to the heat spreader proximate to the respective edge of the heat spreader.*

*31. A semiconductor module according to claim 1, wherein the plurality of electrical contacts disposed on the flexible circuit are electrically and mechanically coupled to a section of the flexible circuit that is bonded to the heat spreader near an apex of the heat spreader.*

*32. A semiconductor module according to claim 1, wherein the first side of the heat spreader and the second side of the heat spreader are substantially perpendicular to the circuit board when the semiconductor module is coupled to the electrical contacts formed in the slot.*

*33. A method according to claim 17, wherein the first side of the heat spreader and the second side of the heat spreader are substantially perpendicular to the circuit board when the semiconductor module is coupled to the electrical contacts formed in the slot.*

*34. A method according to claim 18, further comprising electrically coupling a termination circuit to at least one of the semiconductors, wherein a final semiconductor in the series, remote from the transmission channel, is electrically coupled to the termination circuit.*

*35. A method according to claim 17, further comprising electrically coupling a termination resistor to at least one of the semiconductors, wherein a resistance value of the termination resistor is selected such that an impedance of the termination resistor substantially matches an impedance of a transmission channel and a signal source to which the termination resistor is connected.*

*36. A method according to claim 17, further comprising electrically coupling a termination circuit to at least one of the semiconductors, wherein the termination circuit's form of termination is selected from a group consisting of: parallel termination, Thevenin termination, series termination, AC termination, and Schottky-diode termination.*

*37. A method according to claim 17, further comprising electrically coupling a termination circuit to at least one of the semiconductors, wherein the termination circuit is thermally coupled to the heat spreader.*

*38. A method according to claim 23, wherein the flexible circuit is a flexible dielectric tape.*

*39. A method according to claim 17, wherein the flexible circuit includes a plurality of electrically conductive leads electrically connected to the semiconductors, where at least one of the electrically conductive leads is common to both of the semiconductors.*

*40. A method according to claim 39, wherein the common electrically conductive lead is selected from a group consisting of a voltage supply node, a reference voltage node, and an electrical ground node.*

*41. A method according to claim 17, further comprising mechanically coupling the semiconductor module to a fastening mechanism for anchoring the semiconductor module to a circuit board.*

*42. A method according to claim 30, wherein the fastening mechanism for anchoring the semiconductor module includes a clamp.*

*43. A method according to claim 17, wherein the plurality of electrical contacts disposed on the flexible circuit are a linear array of electrical contact pads coupled to the heat spreader.*

*44. A method according to claim 43, wherein the plurality of electrical contact pads are an array of bond pads.*

*45. A method according to claim 43, wherein the plurality of electrical contact pads are an array of metal points.*

*46. A method according to claim 17, wherein the flexible circuit is at least partially bonded to the heat spreader using a bonding adhesive with thermal expansion properties similar to those of the flexible circuit and the heat spreader.*

*47. A method according to claim 17, wherein the plurality of electrical contacts are disposed at on a section the flexible circuit that is bonded to the heat spreader, and the section the flexible circuit having the plurality of electrical contacts disposed thereon is bonded to the heat spreader proximate to the respective edge of the heat spreader.*

*48. A method according to claim 17, wherein the plurality of electrical contacts disposed on the flexible circuit are electrically and mechanically coupled to a section of the flexible circuit that is bonded to the heat spreader near an apex of the heat spreader.*

*49. A semiconductor module, comprising:*

*a heat spreader comprising a solid block of heat spreading material having a substantially planar first side, a substantially planar opposing second side and a respective edge between the first side and the second side;*

*at least two semiconductors each comprising circuitry, where the semiconductors are thermally coupled to the heat spreader, and one of the semiconductors is disposed at the first side of the heat spreader and another one of the semiconductors is disposed at the second side of the heat spreader;*

*a flexible circuit including a first portion bonded to at least part of the first side of the heat spreader, a second portion wrapped around the respective edge of the heat spreader, and a third portion bonded to at least part of the second side of the heat spreader, wherein the flexible circuit comprises a plurality of electrically conductive leads that are electrically connected to the semiconductors, where at least one of the electrically conductive leads is common to both of the semiconductors;*

*a termination resistor electrically coupled to the circuitry of at least one of the semiconductors; and*

*a plurality of electrical contacts disposed on the flexible circuit proximate to the second portion of the flexible circuit, where each of the plurality of electrical contacts is electrically coupled to at least one of the semiconductors via the flexible circuit, wherein the plurality of electrical contacts are configured to removeably couple the semiconductor module to corresponding electrical contacts formed in a slot on a circuit board when a portion of the semiconductor module, including the respective edge of the heat spreader, the second portion of the flexible circuit wrapped around the respective edge of the heat spreader, and the plurality of electrical contacts, is inserted into the slot.*

* * * * *